(12) United States Patent
Nam et al.

(10) Patent No.: US 11,686,762 B2
(45) Date of Patent: Jun. 27, 2023

(54) MULTI-PROBER CHUCK ASSEMBLY AND CHANNEL

(71) Applicant: KOREA INSTITUTE OF INDUSTRIAL TECHNOLOGY, Cheonan-si (KR)

(72) Inventors: Kyung Tae Nam, Incheon (KR); Seung Joon Lee, Gunpo-si (KR); Kwang Hee Lee, Suwon-si (KR)

(73) Assignee: Korea Institute of Industrial Technology, Cheonan-si (KR)

( * ) Notice: Subject to any disclaimer, the term of this patent is extended or adjusted under 35 U.S.C. 154(b) by 133 days.

(21) Appl. No.: 17/297,657

(22) PCT Filed: Nov. 25, 2019

(86) PCT No.: PCT/KR2019/016249
§ 371 (c)(1),
(2) Date: May 27, 2021

(87) PCT Pub. No.: WO2020/111690
PCT Pub. Date: Jun. 4, 2020

(65) Prior Publication Data
US 2022/0034960 A1  Feb. 3, 2022

(30) Foreign Application Priority Data
Nov. 28, 2018  (KR) ........................ 10-2018-0149659

(51) Int. Cl.
*G01R 31/28*  (2006.01)
*G01R 1/073*  (2006.01)

(52) U.S. Cl.
CPC ..... *G01R 31/2865* (2013.01); *G01R 1/07307* (2013.01)

(58) Field of Classification Search
CPC .......... G01R 31/31702; G01R 31/2831; G01R 31/2648; G01R 31/2642; G01R 31/26
See application file for complete search history.

(56) References Cited

U.S. PATENT DOCUMENTS

2015/0137842 A1* 5/2015 Murakami ......... G01R 31/2608
324/756.01
2018/0213608 A1* 7/2018 Benjaminson .... H01L 21/67103

FOREIGN PATENT DOCUMENTS

JP  2001-203244 A  7/2001
JP  2014-150168 A  8/2014
(Continued)

OTHER PUBLICATIONS

International Search Report of PCT Application No. PCT/KR2019/016249—4 pages (dated Apr. 10, 2020).

*Primary Examiner* — Tung X Nguyen
(74) *Attorney, Agent, or Firm* — Knobbe, Martens, Olson & Bear, LLP

(57) ABSTRACT

A multi-prober chuck assembly and channel are provided. The multi-prober chuck assembly, according to one embodiment of the present invention, comprises: a chuck for supporting a wafer; a probe card structure coupled to the top part of the chuck; a heater for heating the chuck under the chuck; a conductive guard plate spaced apart from the heater below the heater; and a body part positioned under the chuck so that the heater and the guard plate are positioned inside the body part, wherein the probe card structure and the body part are coupled mechanically to form a cartridge-type structure.

20 Claims, 6 Drawing Sheets

(56) References Cited

FOREIGN PATENT DOCUMENTS

| | | |
|---|---|---|
| JP | 2015-106626 A | 6/2015 |
| KR | 10-2002-0019407 A | 3/2002 |
| KR | 10-2016-0015610 A | 2/2016 |
| KR | 10-2164132 B1 | 10/2020 |

* cited by examiner

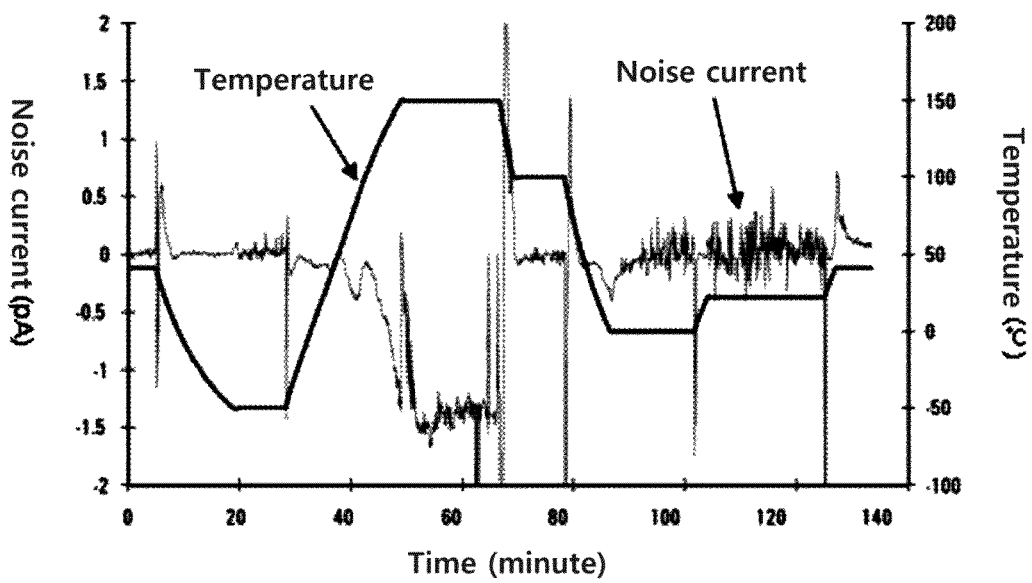
(a) Before shielding leakage current
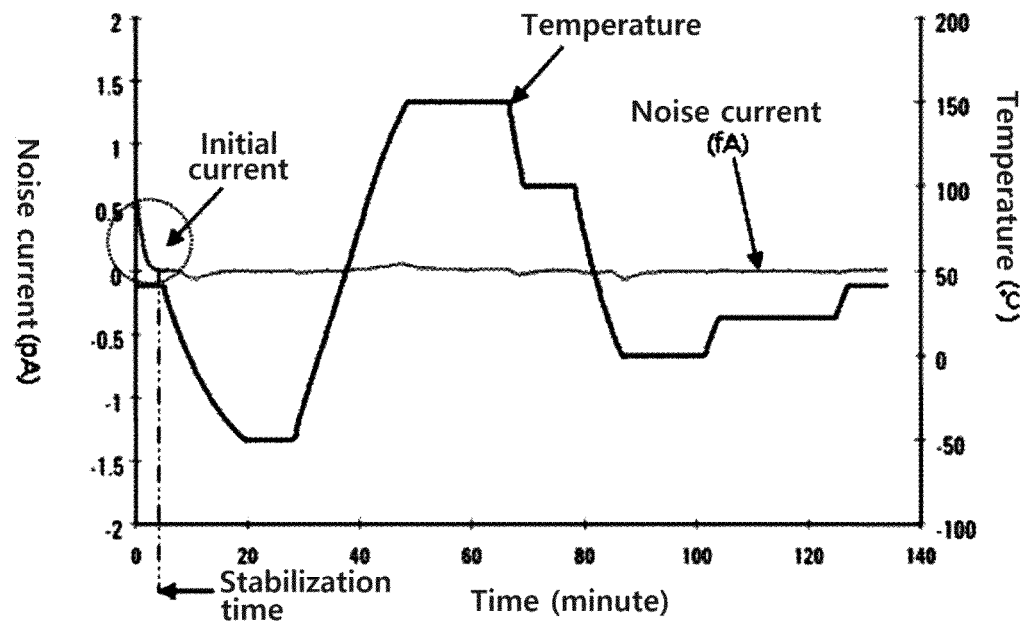
(b) After shielding leakage current
FIG. 9

MULTI-PROBER CHUCK ASSEMBLY AND CHANNEL

CROSS-REFERENCE TO RELATED APPLICATION

This application claims priority to and the benefit of Korean Patent Application No. 10-2018-0149659, filed on Nov. 28, 2018, the disclosure of which is incorporated herein by reference in its entirety.

TECHNICAL FIELD

The present invention relates to a multi-prober chuck assembly and channel.

BACKGROUND

In general, semiconductor devices such as integrated circuit devices may be formed by repeatedly performing a series of semiconductor processes on a semiconductor wafer. For example, by repeatedly performing a deposition process to form a thin film on a wafer, an etching process to form a thin film into patterns having electrical characteristics, an ion implantation process or diffusion process to implant or diffuse impurities into the patterns, a cleaning and rinsing process for removing impurities from a wafer on which patterns are formed, etc., semiconductor devices may be formed on a wafer.

After forming semiconductor devices through a series of processes, an inspection process for inspecting electrical characteristics of the semiconductor devices may be performed. The inspection process may be performed by a probe station including a probe card having a plurality of probes and a tester connected to the probe card to provide an electrical signal.

A conventional general substrate inspection apparatus can inspect one substrate in one inspection. This is referred to as a single probe apparatus. When inspecting a substrate, the single probe apparatus first places a substrate on a substrate chuck. The substrate is transferred from the cassette to the stage. After that, the substrate is aligned by moving the stage to bring the substrate into contact with the probe card. The probe card is brought into contact with the substrate placed on the substrate chuck, and the substrate is inspected using the tester.

The above-described single probe apparatus can inspect only one substrate at a time, so the inspection time is long. In addition, the inspection time is longer compared to the substrate production amount, so there is a disadvantage in that total production time of the throughput is limited.

In order to solve such a problem, it is necessary to develop a multi-prober in order to conduct an electrical testing of several wafers at a time at the same time.

The above information disclosed in this Background section is only for enhancement of understanding of the background of the invention and it may therefore contain information that does not form the prior art that is already known to a person of ordinary skill in the art.

SUMMARY

An embodiment of the present invention is directed to providing a multi-prober chuck assembly capable of electrically testing several wafers at the same time.

In addition, an embodiment of the present invention is directed to providing a multi-prober channel capable of accommodating the multi-prober chuck assembly.

An embodiment of the present invention is directed to providing a multi-prober chuck assembly and channel capable of reducing electromagnetic wave noise and leakage current that may occur as a test throughput of a multi prober increases.

According to an aspect of the present invention, there is provided a multi-prober chuck assembly, comprising: a chuck for supporting a wafer; a probe card structure coupled to the top part of the chuck; a heater for heating the chuck under the chuck; a conductive guard plate spaced apart from the heater below the heater; and a body part positioned under the chuck so that the heater and the guard plate are positioned inside the body part, wherein the multi-prober chuck assembly has a cartridge-type structure by means of the probe card structure and the body part being mechanically coupled.

In this case, an insulating member disposed between the heater and the chuck may be further included.

In this case, a thermal insulating member disposed between the lower portion of the heater and the conductive guard plate may be further included.

In this case, the heater may be shielded by a conductive metal plate and connected to an AC power.

In this case, the conductive guard plate may be formed in two or more, and the two or more conductive guard plates are disposed spaced apart side by side from each other.

In this case, the chuck and the conductive guard plate are electrically separated and spaced apart by an insulating non-conductor.

In this case, a ground member disposed under the guard plate may be further included.

In this case, the probe card structure may include a substrate; a probe formed on the substrate and disposed to face the wafer on the chuck; and a reinforcement part having a larger area than the substrate and supporting the substrate.

The reinforcement part may include an upper reinforcing member positioned on an upper surface of the substrate and a lower reinforcing member positioned on a lower surface of the substrate.

In this case, a locking part formed between reinforcement part and the body part may be included, wherein the locking part may include an upper locker formed under the reinforcement part and a lower locker formed over the body part, and fastening parts that can be mutually fastened by relative rotation between the probe card structure and the body part may be formed on the upper locker and the lower locker.

In this case, a plurality of locking parts may be formed along the outer circumferential part of the substrate.

In this case, a chuck assembly locker formed on the reinforcement part to move the chuck assembly may be further included.

In this case, the body part may include a first body having a plate shape; a second body spaced apart from the first body in a downward direction; an inner body coupled between the first body and the second body; and a rotating body coupled between the first body and the second body that is able to rotate around the inner body, and the lower locker may be disposed on an upper surface of the rotating body.

In this case, a body part support for supporting the first body spaced from the heater may be further included.

In this case, the first body, the second body, the inner body, and the rotating body may be formed in a ring shape.

According to another aspect of the present invention, there is provided a channel, including: a channel housing having an inner space in which the above-described chuck assembly can be seated; a pair of guides formed on opposite sidewalls inside the channel housing so that the chuck assembly can be guided into the inner space of the channel housing; and a chuck assembly adjustment unit formed on a bottom surface of the channel housing to adjust a position of the chuck assembly so that the chuck assembly is seated.

In this case, the channel may further include a guide moving part for moving the height of the guide in the vertical direction.

In this case, the channel housing may be one-point grounded with an AC neutral of AC power to electrically shield the chuck assembly from the outside.

In this case, the chuck assembly adjustment unit may include a driving unit capable of moving the chuck assembly in the x-axis, y-axis, and z-axis directions.

In this case, the channel housing may include a door through which the chuck assembly can enter and exit, on one side thereof.

In this case, the channel housing may include an opening through which a signal line connected to the chuck assembly or a cable connected to the chuck assembly adjustment unit is passed, on the other side thereof.

In this case, the channel housing may be provided as a hexahedral metallic case.

According to an embodiment of the present invention, a multi-prober chuck assembly and a multi-prober channel are provided.

The chuck assembly according to an embodiment of the present invention may be suitable for a multi prober by having a probe card structure, a chuck, and a body part mechanically coupled to form a cartridge-type structure.

In addition, since the probe card structure and the body part are mechanically coupled by the locking part to form a cartridge structure with the chuck on which the wafer is placed being interposed therebetween, the chuck assembly has a simple locking structure to facilitate coupling and separation.

The multi-prober channel according to an embodiment of the present invention has a built-in chuck assembly and can be fixed in position inside the channel, whereby it can be safely moved even when moving, and the channel can be electrically shielded from the outside by being AC shielded.

The chuck assembly according to an embodiment of the present invention can suppress noise and leakage current generated by the heater coupled to the wafer chuck by forming a guard plate and a ground member under the heater.

In addition, the chuck assembly according to an embodiment of the present invention can suppress leakage current by introducing a guard plate using air as a dielectric constant value.

In addition, the chuck assembly according to an embodiment of the present invention can minimize EMI/EMS noise such as inductive noise and conductive noise by shielding the heater with a metallic conductor and connecting the heater to an AC power.

BRIEF DESCRIPTION OF THE DRAWINGS

The above and other aspects, features, and advantages of the present invention will become more apparent to those of ordinary skill in the art by describing embodiments thereof in detail with reference to the accompanying drawings, in which:

FIG. 9 is a comparison graph of noise before and after a leakage current is blocked by a multi-prober chuck assembly and channel according to an exemplary embodiment of the present invention.

DETAILED DESCRIPTION OF THE EMBODIMENTS

Figure 1:
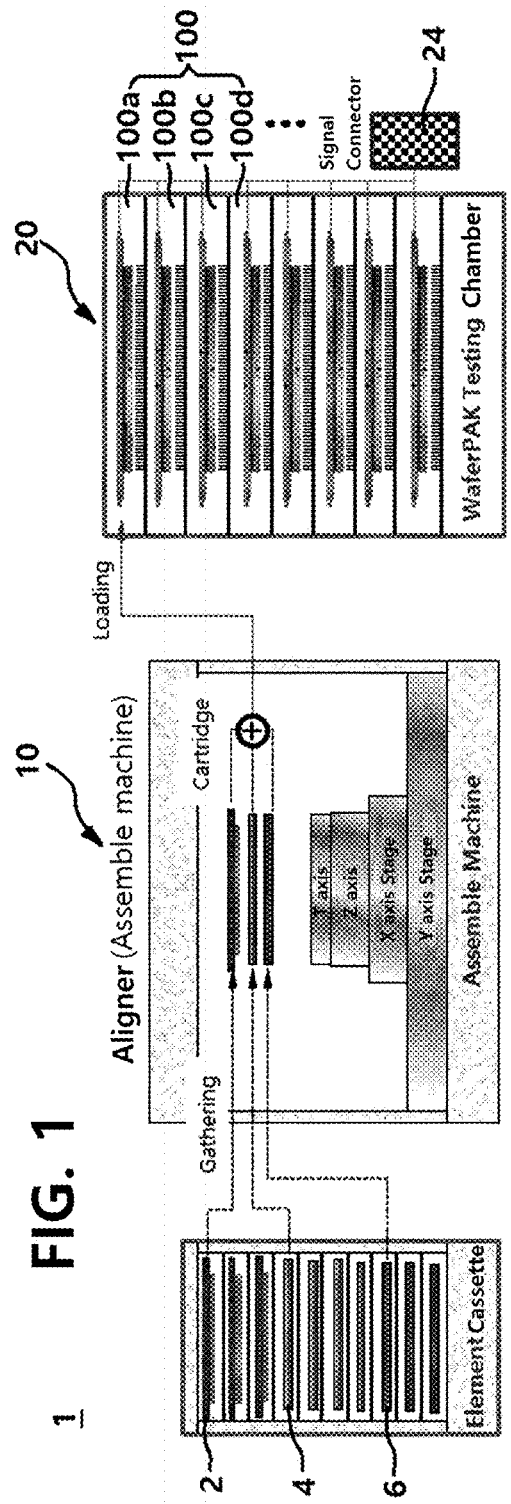
FIG. 1 is a schematic view of a multi prober to which a multi-prober channel and chuck assembly according to an exemplary embodiment of the present invention is applied.

Hereinafter, exemplary embodiments of the present invention will be described in detail so that those of ordinary skill in the art can readily implement the present invention with reference to the accompanying drawings. The present invention may be embodied in many different forms and are not limited to the embodiments set forth herein. In the drawings, parts unrelated to the description are omitted for clarity. Throughout the specification, like reference numerals denote like elements.

Figure 2:
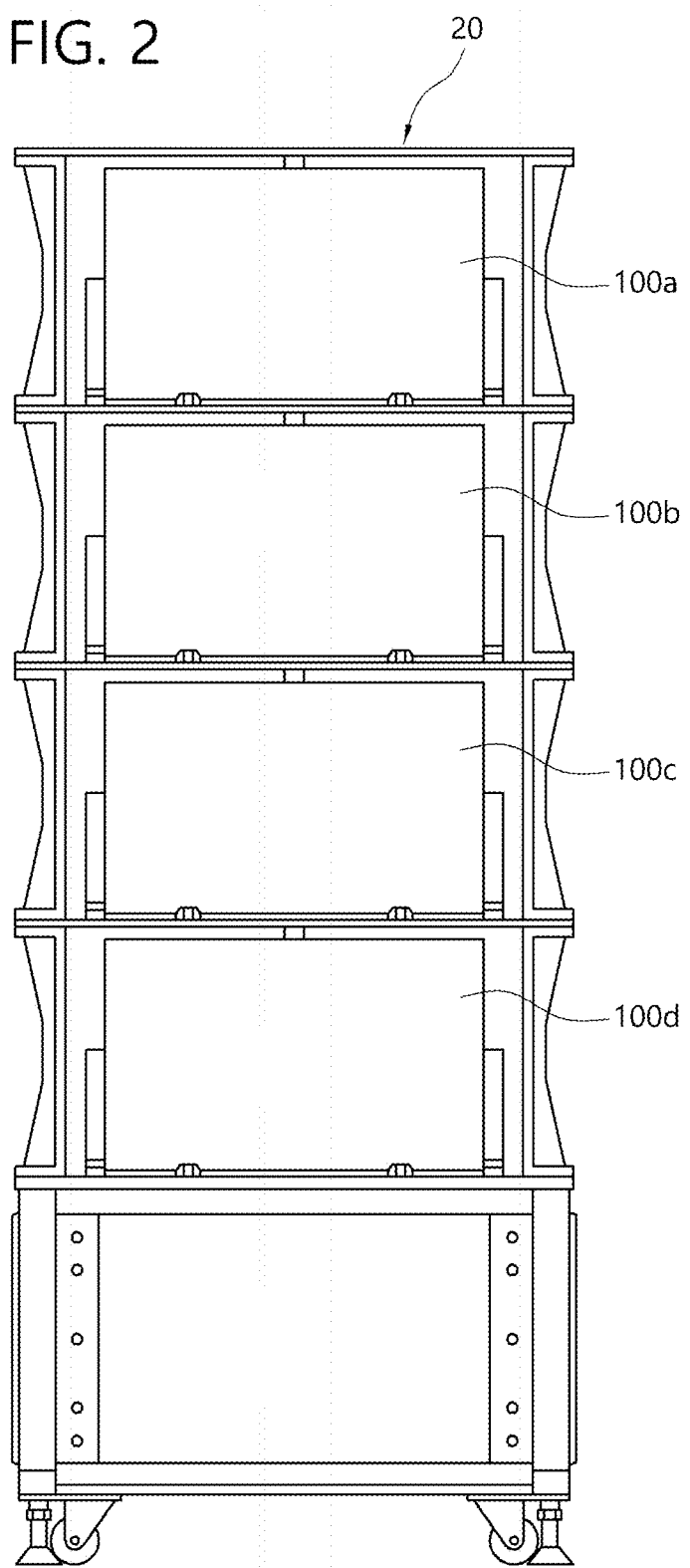
FIG. 2 is a diagram illustrating a stacked form of multi-prober channels according to an exemplary embodiment of the present invention.

FIG. 1 is a schematic view of a multi prober to which a multi-prober channel and chuck assembly according to an exemplary embodiment of the present invention is applied. FIG. 2 is a diagram illustrating a stacked form of multi-prober channels according to an exemplary embodiment of the present invention.

A multi prober 1 to which a multi-prober channel and chuck assembly according to an exemplary embodiment of the present invention is applied is for electrically testing of several wafers 4 at a time at the same time.

Referring to FIG. 1, for the multi prober 1 according to an embodiment of the present invention, after preparing a number of probe cards 2 for probe, wafers 4 and chucks 6 in advance, and then one probe card 2, one wafer 4 and one chuck 6, which are basic units of the electrical test, are combined in a cartridge form to produce one cartridge.

In this case, an aligner 10 is provided to combine one probe card 2, one wafer 4, and one chuck 6 into a cartridge-type chuck assembly.

Each of the plurality of chuck assemblies combined by the aligner 10 may be sequentially inserted into a chamber 20 including a plurality of channels 100a, 100b, 100c, and 100d, and a multi test may be performed at the same time. In this case, one cartridge type chuck assembly may be loaded in one channel. In this case, the plurality of channels 100a, 100b, 100c, and 100d in the chamber may be connected to a signal connector 24 to be connected to external equipment.

Referring to FIG. 2, the multi prober chamber 20 may be formed in a form in which the plurality of channels 100a, 100b, 100c, and 100d are stacked, and when the chuck assembly is loaded into the channel 100, a test may be performed by loading an assembled chuck assembly in order of empty channels among the channels 100.

In this way, since the test can be performed by loading a plurality of chuck assemblies into the plurality of channels 100a, 100b, 100c, and 100d, the multi prober 1 has the advantage of remarkably increasing test throughput. On the other hand, as the number of channels increases, the number of test ports increase. In this case, electromagnetic wave (EMI/EMS) noise and leakage current that increase in proportion to the increased number of channels should be reduced.

In the case of the multi prober 1, the tester interface is possible only when countermeasures against noise and leakage current are fundamentally prepared within each channel.

The chuck assembly and channel according to an embodiment of the present invention provide a structure capable of suppressing noise and leakage current in the multi prober 1. Hereinafter, with different drawings, a chuck assembly and a channel according to an embodiment of the present invention will be described in more detail.

Figure 3:
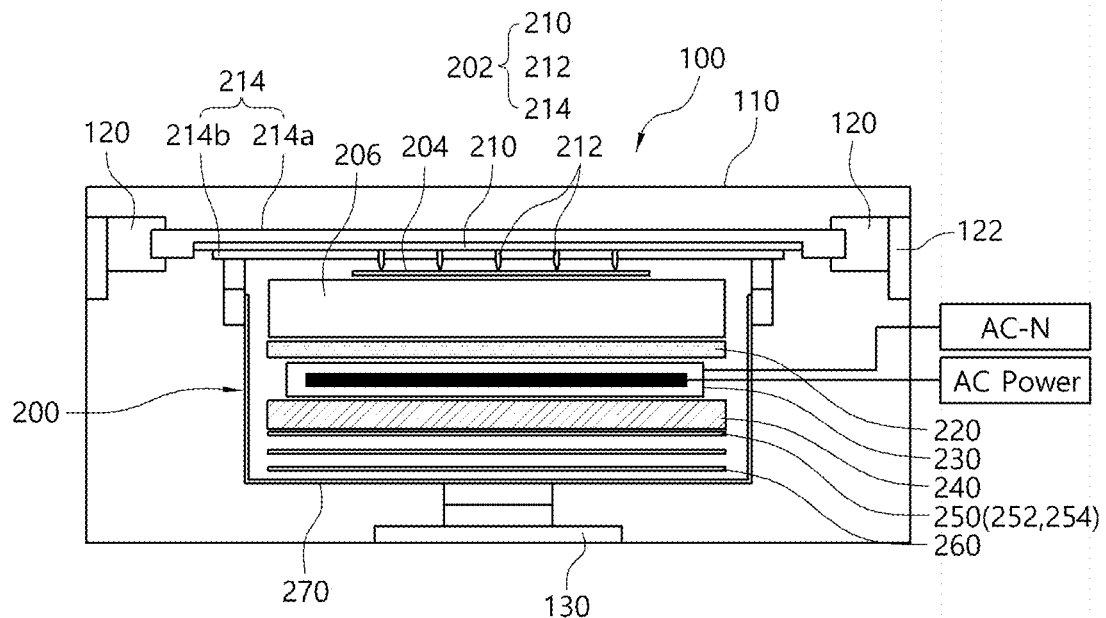
FIG. 3 is a composition diagram of a multi-prober channel and chuck assembly according to an exemplary embodiment of the present invention.
Figure 4:
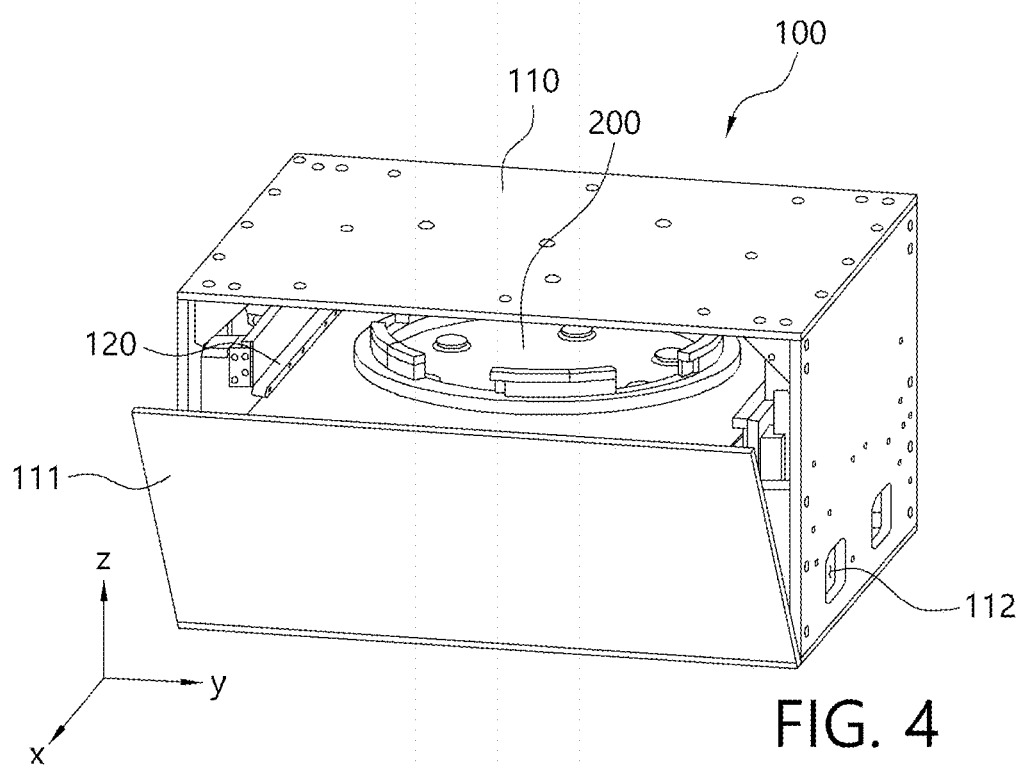
FIG. 4 is a perspective view illustrating a state in which a chuck assembly is inserted into a multi-prober channel according to an exemplary embodiment of the present invention.
Figure 5:
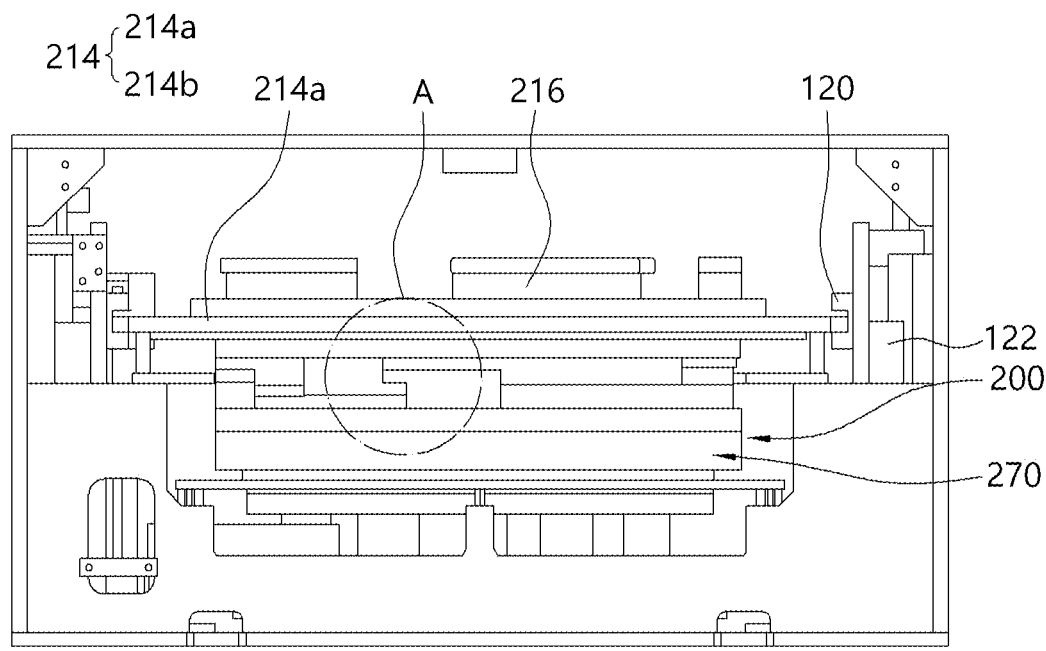
FIG. 5 is a front view illustrating a state in which a chuck assembly is inserted into a multi-prober channel according to an exemplary embodiment of the present invention and is, more particularly, a front view partially cut away from one side of the channel.
Figure 6:
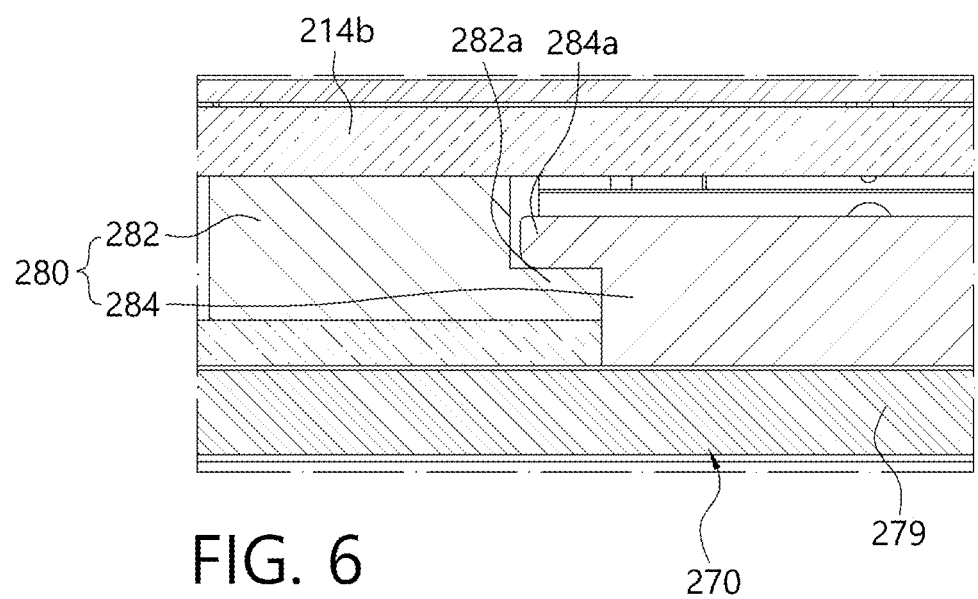
FIG. 6 is an enlarged view of part A in FIG. 5.
Figure 7:
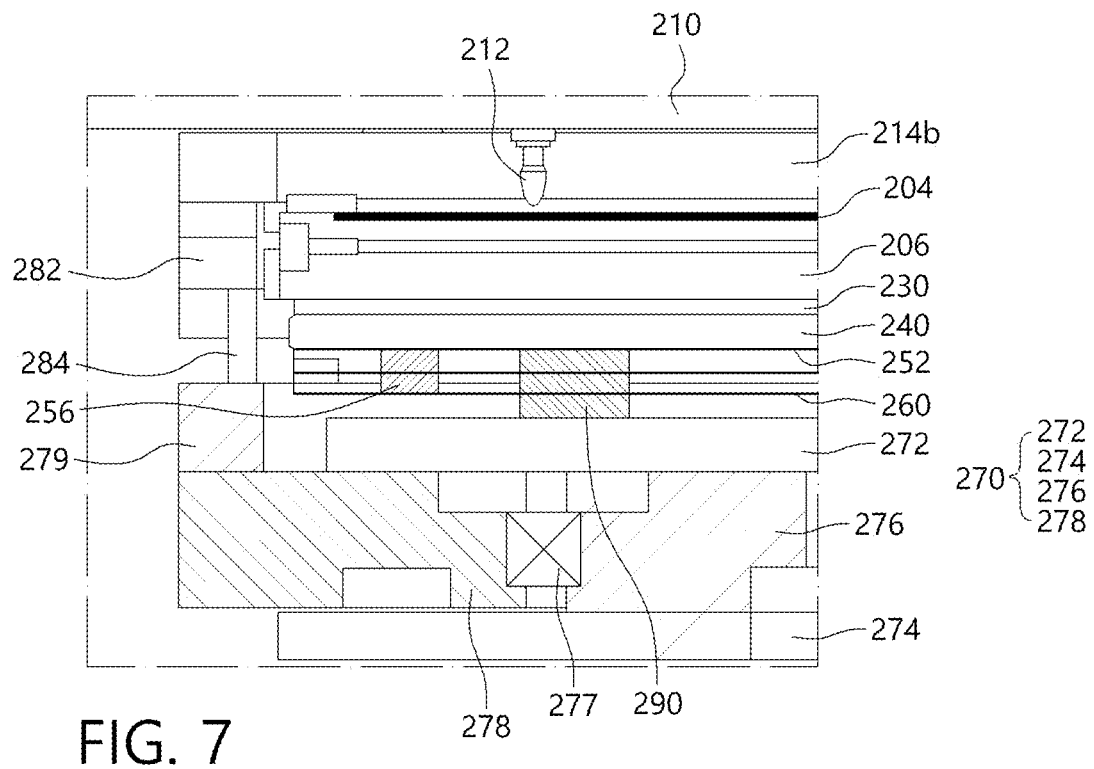
FIG. 7 is a cross-sectional view of a portion of a multi-prober chuck assembly according to an exemplary embodiment of the present invention.
Figure 8:
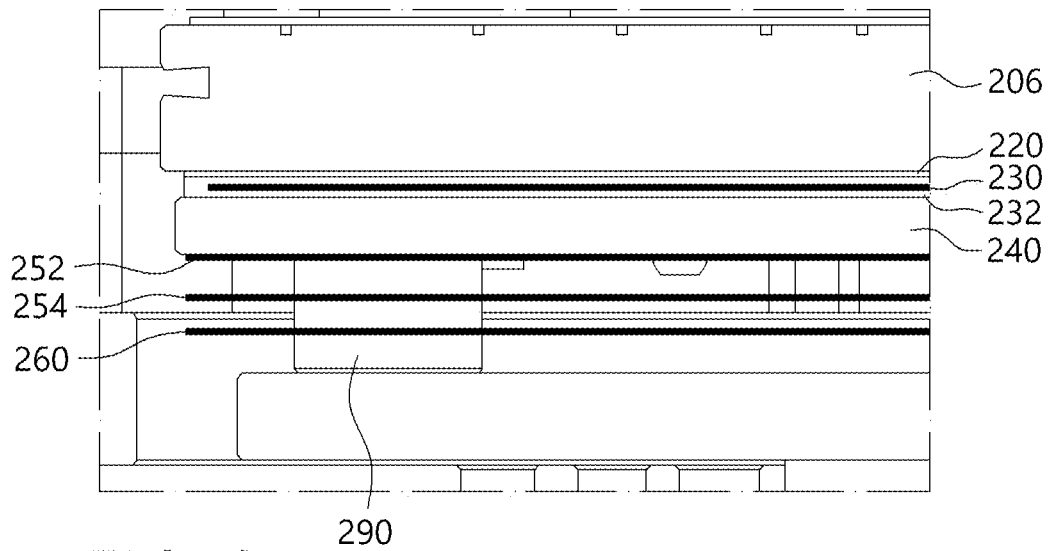
FIG. 8 is a cross-sectional view of another part of a multi-prober chuck assembly according to an exemplary embodiment of the present invention.

FIG. 3 is a schematic composition diagram of a multi-prober channel 100 and chuck assembly 200 according to an exemplary embodiment of the present invention. FIG. 4 is a perspective view illustrating a state in which a chuck assembly 200 is inserted into a multi-prober channel 100 according to an exemplary embodiment of the present invention. FIG. 5 is a front view illustrating a state in which a chuck assembly 200 is inserted into a multi-prober channel 100 according to an exemplary embodiment of the present invention and is, more particularly, a front view partially cut away from one side of the channel. FIG. 6 is an enlarged view of part A in FIG. 5. FIG. 7 is a cross-sectional view of a portion of a multi-prober chuck assembly 200 according to an exemplary embodiment of the present invention. FIG. 8 is a cross-sectional view of another part of a multi-prober chuck assembly 200 according to an exemplary embodiment of the present invention. FIG. 9 is a comparison graph of noise before and after a leakage current is blocked by a multi-prober chuck assembly 200 and channel 100 according to an exemplary embodiment of the present invention.

According to an embodiment of the present invention, the multi-prober chuck assembly 200 may be loaded into the multi-prober channel 100 after assembly. Hereinafter, the channel 100 will be described first, and then the structure of the chuck assembly 200 will be described.

Referring to FIGS. 3 to 5, the channel 100 into which the chuck assembly 200 according to an embodiment of the present invention can be loaded may include a channel housing 110 having an inner space in which the chuck assembly 200 can be seated.

In this case, the channel housing 110 may be provided as a hexahedral metallic case. The channel housing 110 may be lightened by using electroless nickel plated aluminum, and may be surface-treated to have electrical conductivity.

As such, the channel housing 110 provided as a metallic case may be one-point grounded with an AC neutral filtered by a filter having an inductance of AC power. Accordingly, when the chuck assembly 200 is loaded into the channel housing 110, the chuck assembly 200 may be electrically shielded from the outside of the channel housing 110.

In the front of the channel housing 110, a door 111 through which the chuck assembly 200 can enter and exit may be provided, and on one side, an opening 112 through which a signal line connected to the chuck assembly 200 inserted therein or a power cable or signal cable connected to a driving unit inside the channel housing is passed may be formed.

A pair of guides 120 for guiding the chuck assembly 200 may be installed on opposite sides inside the channel housing 110 in a direction in which the chuck assembly 200 is inserted. Accordingly, opposite ends of the chuck assembly 200 may be guided by the pair of guides 120 so that the chuck assembly 200 may be inserted into the channel housing 110.

The pair of guides 120 may be supported by the guide moving parts 122 so that the height can be moved in the vertical direction inside the channel housing 110. The guide moving part 122 for moving the guide 120 may be implemented by a linear motor or the like, but is not limited thereto.

Meanwhile, a chuck assembly adjustment unit 130 on which the chuck assembly 200 is seated is provided on the bottom surface of the channel housing 110. The chuck assembly adjustment unit 130 may be implemented as a driving unit, that is, a moving stage, capable of moving the position of the chuck assembly 200 in the x-axis, y-axis, and z-axis directions. Such a moving stage may be composed of a moving stage having various known structures, so a detailed description thereof will be omitted in the present specification.

According to an embodiment of the present invention, the chuck assembly 200 inserted into the channel housing 110 along the pair of guides 120 may be seated on the chuck assembly adjustment unit 130 and then fixed in position inside the channel housing 110. As such, the chuck assembly 200 fixed in position inside the channel housing 110 may stably move together with the channel housing 110 even when it is moved together with the channel housing 110.

The chuck assembly 200 according to an embodiment of the present invention that can be inserted into the channel having the above structure, as can be seen from FIGS. 3 to 5, may include a chuck 206, a probe card structure 202, a heater 230, a conductive guard plate 250, and a body part 270. In this case, the probe card structure 202 and the body part 270 may be mechanically coupled to each other to have a cartridge-type structure.

In more detail, the probe card structure 202 may include a substrate 210, a probe and a substrate reinforcement part 214.

The substrate 210 is formed as a PCB substrate, and may be formed in a circular plate shape. A plurality of probes 212 may be formed on the lower surface of the substrate 210 to protrude toward the wafer 204. In this case, various devices inside the wafer 204 may be tested using the plurality of probes 212.

The substrate reinforcement part 214 may include an upper reinforcing member 214a coupled to an upper surface of the substrate 210 and a lower reinforcing member 214b coupled to a lower surface of the substrate 210, and may prevent the substrate 210 from being bent by an external force while moving or in a stationary state.

In an embodiment of the present invention, the upper reinforcing member 214a of the substrate reinforcement part 214 may be formed as a plate-shaped member having a square plane, and opposite corners of the upper reinforcing member 214a may be inserted into the guides 120 in the channel housing 110 so that the chuck assembly 200 may move along the guide 120 when the chuck assembly 200 moves in the channel housing 110.

A chuck assembly locker 216 may be formed on the upper reinforcing member 214a so that the chuck assembly 200 may be moved in a cartridge state with coupled to a transfer robot (not shown).

Meanwhile, the lower reinforcing member 214b may be coupled to the lower surface of the substrate 210 and may be formed in a ring shape. An upper locker 282 of a locking part 280 to be described later is positioned under the lower reinforcing member 214b.

The chuck 206 may have a cylindrical shape and may have a seating surface on which the wafer 4 is positioned. As an example, the chuck 206 may be lightened by using electroless nickel plated aluminum, and may be surface-treated to have electrical conductivity. In this case, the chuck 206 may operate as a signal line (+pole).

An insulating member 220 may be provided under the chuck 206 to insulate e chuck 206 from the outside.

In addition, a heater 230 may be disposed under the insulating member 220. In this case, the heater 230 is provided to heat the chuck 206, and a thermal insulating member 240 may be provided under the heater 230 so that heat of the heater 230 can be transferred only in the chuck direction.

According to an embodiment of the present invention, in order to AC-shield electromagnetic wave noise (EMI/EMS) generated by the heater 230, a conductive metal plate may be applied as a heater shielding plate (232 of FIG. 8) on opposite sides of the upper and lower surfaces of the heater 230. In this case, the heater shielding plate 232 may be connected to a filtered neutral of AC power, and a zero-crossing power conversion power may be used so that there is no switching noise by the power of the heater 230.

One or more conductive guard plates 250 may be installed under the heater 230. In the chuck assembly 200 according to the present embodiment, a structure in which two conductive guard plates 252 and 254 are provided is disclosed. The first guard plate 252 and the second guard plate 254 are spatially spaced apart side by side from the heater 230. In this case, the distance between the two guard plates 252 and 254 may be 2 to 5 mm, but is not limited thereto.

In order to minimize the leakage current of the chuck assembly 200, the dielectric constant needs to be minimum and the insulation resistance needs to be maximum between the chuck (+pole, signal line) and the guard plate 250. In order to satisfy these conditions, in the chuck assembly 200 according to an embodiment of the present invention, a plurality of guard plates 252 and 254 are spaced apart from each other in the air under the heater 230 to make the air to act as a medium. in this case, it goes without saying that the number of the guard plates 250 to be stacked and the separation distance, etc. may be experimentally selected.

According to an embodiment of the present invention, a guard support 256 may be disposed between the heater 230 and the guard plate 250 and neighboring guard plates in order to dispose the plurality of guard plates 250 spaced apart. It is preferable that the guard support 256 is formed of a heat insulating material having no electrical conductivity and thermal conductivity.

A conductive metal ground member 260 may be provided under the plurality of guard plates 250 for signal grounding. The ground member 260 may act as a (−) pole. In this case, the ground member 260 may be made of a copper plate or the like having low electrical resistance and excellent conductivity, but is not limited thereto. In addition, the position, quantity, and shape of the plurality of guard plates 250 and the ground member 260 may be variously changed according to the type of noise.

According to an embodiment of the present invention, in order to position the heater 230, the plurality of guard plates 250, and the ground member 260 under the chuck 206, a body part 270 is provided under the chuck 206. According to an embodiment of the present invention, the probe card structure 202 and the body part 270 are mechanically coupled to each other so that the chuck assembly 200 is formed to have a cartridge-type structure.

Referring to FIG. 7, in an embodiment of the present invention, the body part 270 may include a first body 272, a second body 274, an inner body 276, and a rotating body 278.

The first body 272 may be formed in a circular or ring-shaped plate shape. The first body 272 is made of a metal material having a predetermined thickness, so that the inside of the body part 270 provided with the heater 230, the guard plate 250, etc. of the cartridge-type chuck assembly 200 can be protected.

One or more body part support 290 may be disposed between the first body 272 and the heater 230 to maintain a gap between the first body 272 and the heater 230. This is to maintain a space in which the guard plate 250 and the ground member 260 are to be disposed between the heater 230 and the first body 272.

The second body 274 is spaced apart from the first body 272 in a downward direction. The second body 274 may have a circular shape or a ring shape, and may have a plate shape having a predetermined thickness.

The inner body 276 made of a circular or ring-shaped plate may be fixed between the first body 272 and the second body 274.

In this case, the rotating body 278 may be rotatable coupled to the outer circumferential part of the inner body 276. The rotating body 278 may be formed of a ring-shaped plate member. The thickness of the rotating body 278 may correspond to the thickness of the inner body 276. A rotating bearing 277 is positioned and formed between the rotating body 278 and the inner body 276 so that the rotating body 278 can rotate around the inner body 276. That the rotating body 278 is formed to rotate with respect to the inner body 276 is to enable an upper locker 282 and a lower locker 284 of the locking part 280 to be described later to be mutually fastened or released.

In this case, the outer circumferential part of the rotating body 278 is formed to have a larger diameter than the first body 272 and the second body 274, and the outer circumferential part thereof is formed to protrude more outward than the first body 272 and the second body 274. A ring-shaped partition wall 279 protruding in the chuck direction may be coupled to an upper surface of the outer circumferential part of the rotating body 278. The guard plate 250 and the ground member 260 may be protected by the ring-shaped partition wall 279 from the outside under the chuck 206.

Referring to FIGS. 5 to 7, the locking part 280 is formed between the substrate reinforcement part 214 of the probe card structure 202 and the body part 270. In more detail, the locking part 280 may include the upper locker 282 formed under the lower reinforcing member 214b of the probe card structure 202 and the lower locker 284 formed over the ring-shaped partition wall 279 of the body part 270.

Fastening parts that can be mutually fastened by relative rotation between the probe card structure 202 and the body part 270 are formed on the upper locker 282 and the lower locker 284.

The fastening part may include a first protrusion 282a protruding from the upper locker 282 in the transverse direction, and a second protrusion 284a protruding from the lower locker 284 in a direction opposite to the first protrusion 282a. After the probe card structure 202 and the body part 270 are disposed adjacent to each other while the first protrusion 282a and the second protrusion 284a do not overlap in the vertical direction, as the body part 270 is rotated with respect to the probe card structure 202 by a predetermined angle to the left as viewed in FIG. 6, the upper surface of the first protrusion 282a and the lower surface of the second protrusion 284a are in contact to fasten the probe card structure 202 and the body part 270.

According to an embodiment of the present invention, the body part 270 is formed of a metal material to have a predetermined weight, and is formed to be locked by gravity by the weight of the body part 270 in a state in which the upper locker 282 and the lower locker 284 are fastened.

In the case of releasing the fastening between the probe card structure 202 and the body part 270, when the body part 270 is rotated with respect to the probe card structure 202 by a predetermined angle in the right direction as seen in FIG. 6, the first protrusion 282a and the second protrusion 284a is not in contact, and the probe card structure 202 and the body part 270 can be separated from each other in a state in which the first protrusion 282a and the second protrusion 284a are not in contact.

According to an embodiment of the present invention, a plurality of locking parts 280 may be installed spaced apart on the lower reinforcing member 214b of the probe card structure 202 and the ring-shaped partition wall 279 along the outer circumferential part of the substrate 210 in the circumferential direction.

When the probe card structure 202 is coupled to the body part 270 by the locking structure of the locking part 280 as described above, the chuck assembly 200 may be assembled in the form of a cartridge. The assembly of the probe card structure 202 and the body part 270 may be performed in the aligner 10 as described above, and the cartridge type chuck assembly assembled in the aligner 10 may be moved into the channel by the transfer robot, then a subsequent process may be performed.

According to an embodiment of the present invention, by installing one or two or more guard plates between the chuck and the ground member of the chuck assembly, not only the wafer is electrically protected from disturbances, but also a relative level is provided between the chuck (+pole) and the ground member (–pole), whereby the noise level based on the ground member can be significantly suppressed.

FIG. 9 is a comparison graph of noise before and after a leakage current is blocked by a multi-prober chuck assembly and channel according to an exemplary embodiment of the present invention.

As can be seen from FIG. 9, it can be seen that noise was hardly generated after the leakage current was blocked compared to before the leakage current was blocked in the multi-prober chuck assembly and channel according to an embodiment of the present invention.

In more detail, referring to FIG. 9(a), before the leakage current was shielded in the multi-prober chuck assembly and channel according to an embodiment of the present invention, the noise current of the leakage current occurred from −1.5 pA to 2 pA.

However, referring to FIG. 9(b), the noise current of the leakage current was generated within 0.5 pA until the initial stabilization time (within 5 minutes) after the leakage current was shielded, and was generated within 0.3 pA after the stabilization time, that was hardly occurred.

Although exemplary embodiments of the present invention have been described above, the spirit of the present invention is not limited to the embodiments set forth herein. Those of ordinary skill in the art who understand the spirit of the present invention may easily propose other embodiments through supplement, change, removal, addition, etc. of elements within the same spirit, but the embodiments will be also within the scope of the present invention.

What is claimed is:

1. A multi-prober chuck assembly, comprising:
   a chuck for supporting a wafer;
   a probe card structure coupled to the top part of the chuck;
   a heater for heating the chuck under the chuck;
   a conductive guard plate spaced apart from the heater below the heater; and
   a body part positioned under the chuck so that the heater and the guard plate are positioned inside the body part,
   wherein the probe card structure and the body part are coupled mechanically to form a cartridge-type structure, and
   wherein the conductive guard plate is formed in two or more, and the two or more conductive guard plates are disposed spaced apart side by side from each other, and the chuck and the conductive guard plate are electrically separated and spaced apart by an insulating non-conductor.

2. The chuck assembly of claim 1, further comprising an insulating member disposed between the heater and the chuck.

3. The chuck assembly of claim 1, further comprising a thermal insulating member disposed between the lower portion of the heater and the conductive guard plate.

4. The chuck assembly of claim 1, wherein the heater is shielded by a conductive metal plate and connected to an AC power.

5. The chuck assembly of claim 1, wherein the conductive guard plate is formed in two or more, and the two or more conductive guard plates are disposed spaced apart side by side from each other, and the chuck and the conductive guard plate are electrically separated and spaced apart by an insulating non-conductor.

6. The chuck assembly of claim 1, wherein the probe card structure comprises a substrate; a probe formed on the substrate and disposed to face the wafer on the chuck; and a reinforcement part for supporting the substrate.

7. The chuck assembly of claim 6, wherein the reinforcement part comprises an upper reinforcing member positioned on an upper surface of the substrate and a lower reinforcing member positioned on a lower surface of the substrate.

8. A multi-prober channel, comprising:
   a channel housing having an inner space in which a chuck assembly according to claim 1 can be seated;
   a pair of guides formed on opposite sidewalls inside the channel housing so that the chuck assembly can be guided into the inner space of the channel housing; and
   a chuck assembly adjustment unit formed on a bottom surface of the channel housing to adjust a position of the chuck assembly so that the chuck assembly is seated.

9. The channel of claim 8, further comprising a guide moving part for moving the height of the guide in the vertical direction.

10. The channel of claim 8, wherein the channel housing is one-point grounded with an AC neutral of AC power to electrically shield the chuck assembly from the outside.

11. The channel of claim 8, wherein the chuck assembly adjustment unit comprises a driving unit capable of moving the chuck assembly in the x-axis, y-axis, and z-axis directions.

12. The channel of claim 8, wherein the channel housing is provided as a hexahedral metallic case.

13. A multi-prober chuck assembly, comprising:
a chuck for supporting a wafer;
a probe card structure coupled to the top part of the chuck;
a heater for heating the chuck under the chuck;
a conductive guard plate spaced apart from the heater below the heater; and
a body part positioned under the chuck so that the heater and the guard plate are positioned inside the body part,
wherein the probe card structure and the body part are coupled mechanically to form a cartridge-type structure,
wherein the probe card structure comprises a substrate; a probe formed on the substrate and disposed to face the wafer on the chuck; and a reinforcement part for supporting the substrate,
wherein the chuck assembly further comprises a locking part formed between the reinforcement part and the body part, and
wherein the locking part comprises an upper locker formed under the reinforcement part and a lower locker formed over the body part, and fastening parts that can be mutually fastened by relative rotation between the probe card structure and the body part are formed on the upper locker and the lower locker.

14. The chuck assembly of claim 13, wherein the body part comprises a first body having a plate shape; a second body spaced apart from the first body in a downward direction; an inner body coupled between the first body and the second body; and a rotating body coupled between the first body and the second body that is able to rotate around the inner body, and the lower locker is disposed on an upper surface of the rotating body.

15. The chuck assembly of claim 14, wherein the first body, the second body, the inner body, and the rotating body are formed in a ring shape.

16. A multi-prober channel, comprising:
a channel housing having an inner space in which a chuck assembly according to claim 8 can be seated;
a pair of guides formed on opposite sidewalls inside the channel housing so that the chuck assembly can be guided into the inner space of the channel housing; and
a chuck assembly adjustment unit formed on a bottom surface of the channel housing to adjust a position of the chuck assembly so that the chuck assembly is seated.

17. The channel of claim 16, further comprising a guide moving part for moving the height of the guide in the vertical direction.

18. The channel of claim 16, wherein the channel housing is one-point grounded with an AC neutral of AC power to electrically shield the chuck assembly from the outside.

19. The channel of claim 16, wherein the chuck assembly adjustment unit comprises a driving unit capable of moving the chuck assembly in the x-axis, y-axis, and z-axis directions.

20. The channel of claim 16, wherein the channel housing is provided as a hexahedral metallic case.

\* \* \* \* \*